(12) United States Patent
Kitagawa et al.

(10) Patent No.: US 8,379,430 B2
(45) Date of Patent: Feb. 19, 2013

(54) MEMORY DEVICE AND METHOD OF READING MEMORY DEVICE

(75) Inventors: Makoto Kitagawa, Kanagawa (JP);
Tsunenori Shiimoto, Kanagawa (JP);
Hiroshi Yoshihara, Yokohama (JP)

(73) Assignee: Sony Corporation, Tokyo (JP)

( * ) Notice: Subject to any disclaimer, the term of this patent is extended or adjusted under 35 U.S.C. 154(b) by 200 days.

(21) Appl. No.: 12/923,978

(22) Filed: Oct. 19, 2010

(65) Prior Publication Data

US 2011/0110142 A1    May 12, 2011

(30) Foreign Application Priority Data

Nov. 10, 2009    (JP) .................................. 2009-257468

(51) Int. Cl.
*G11C 11/00* (2006.01)
*G11C 7/02* (2006.01)
(52) U.S. Cl. ...................... 365/148; 365/207; 365/210.1
(58) Field of Classification Search .................. 365/148, 365/207, 210.1
See application file for complete search history.

(56) References Cited

U.S. PATENT DOCUMENTS

| 6,061,286 | A |  | 5/2000 | Baroni et al. |
| 2002/0131312 | A1 | * | 9/2002 | Issa et al. ...................... 365/207 |
| 2010/0165755 | A1 | * | 7/2010 | Dhori ........................ 365/189.15 |
| 2011/0141794 | A1 | * | 6/2011 | Kurosawa et al. ............ 365/148 |

FOREIGN PATENT DOCUMENTS

| JP | 2002-260377 | 9/2002 |
| JP | 2005-510005 | 4/2005 |
| JP | 4044538 | 11/2007 |
| JP | 2009-026364 | 2/2009 |

OTHER PUBLICATIONS

K. Aratani, et al. "A Novel Resistance Memory with High Scalability and Nanosecond Switching," Technical Digest IEDM 2007, pp. 783-786.

T. Suzuki et al., "0.3 to 1.5V Embedded SRAM with Device-Fluctuation-Tolerant Access-Control and Cosmic-Ray-Immune Hidden-Ecc Scheme," 2005 IEEE International Solid-State Circuits Conference, Session 26, pp. 484-485 and 612.

* cited by examiner

*Primary Examiner* — Ly D Pham
(74) *Attorney, Agent, or Firm* — Rader, Fishman & Grauer PLLC

(57) ABSTRACT

A memory device includes: a memory unit in which an electric charge discharging rate between two electrodes is different in accordance with logic of stored information; a sense amplifier that detects the logic of the information by comparing a discharge electric potential of a wiring to which one electrode of the memory unit is connected with a reference electric potential; and a replica circuit that has a replica unit emulating the memory unit and controls a sense timing of the sense amplifier in accordance with a discharge rate of the replica unit.

18 Claims, 13 Drawing Sheets

MEMORY DEVICE AND METHOD OF READING MEMORY DEVICE

BACKGROUND OF THE INVENTION

1. Field of the Invention

The present invention relates to a memory device having a memory unit in which an electric charge discharging rate between two electrodes is different in accordance with the logic of stored information and a method of reading the memory device.

2. Description of the Related Art

Non-volatile memory devices that read out a difference in the discharge rate by applying a precharge voltage to a bit line are known.

As a representative example of the non-volatile semiconductor memory device to which such a reading method can be applied, there is an (flash) EEPROM.

On the other hand, in order to replace an FG-type (flash) EEPROM, as non-volatile memory devices that can rewrite data at a high speed, variable resistance-type memory devices have attracted attention.

As variable resistance-type memory devices, so-called ReRAMs are known in which a change in the resistance at the time of the input/output of conductive ions to/from a conductive film disposed within a memory unit is associated with a memory state (for example, see K. Aratani, etc. "A Novel Resistance Memory with High Scalability and Nanosecond Switching", Technical Digest IEDM 2007, pp. 783-786).

In order to assure the reliability of rewriting characteristics, maintaining characteristics, and the like of the ReRAM and in order to apply the ReRAM further to a multiple-valued memory, as in a general flash memory or the like, a method in which a verify•read operation is performed at the time of a write operation or an erase operation is reviewed (for example, see JP-A-2009-26364, JP-A-2002-260377, and JP-A-2005-510005).

In the control of a current that is performed when a verify•read operation of a general flash memory is performed, a reading current (sense current) is approximately constant. Accordingly, by changing the electric potential of the gate of a memory transistor, a different threshold is verified. This operation method has the following merit. According to the operation method, the operating current is constant, and accordingly, the sense timing, the load of the sense node, and the like are hardly dependent upon a threshold to be verified.

A technology in which a replica cell that emulates a memory cell is used for generating a control signal in response to the timing of the operation of a memory cell is known (see Japanese Patent No. 4044538, U.S. Pat. No. 6,061,286, and T. Suzuki, etc. "0.3 to 1.5V Embedded SRAM with Device-Fluctuation-Tolerant Access-Control and Cosmic-Ray-Immune Hidden-ECC Scheme", ISSCC 2005/SESSION 26/STATIC MEMORY/26. 6, IEEE 2005).

Such documents relate to implementation of high-speed code writing or low power consumption of an ECC circuit using timing control on the basis of a replica cell.

SUMMARY OF THE INVENTION

However, according to the ReRAM, there is a limitation, which is different from the flash memory.

The memory unit of the ReRAM has only two terminals. In other words, there are only two terminals, through which currents flow, that correspond to the source terminal and the drain terminal of the flash memory, and there is no gate terminal. Here, in a case where a different resistance value is read out at the time of a verify operation, it is assumed that the precharge voltage (=VR) applied to the ReRAM at the time of a read operation is constant, and the resistance (cell resistance) of the memory unit of the ReRAM is Rcell. In such a case, the reading current becomes (VR/Rcell). This indicates that the reading current is changed when the cell resistance Rcell is changed.

In the case of the ReRAM, the cell resistance Rcell is different by several digits in accordance with the logic of the stored information. Accordingly, for the above-described reason, in order to perform a verify•read operation at a high speed, control of the sense timing is necessary as described below.

Described in detail, when a verify•read operation is performed by lowering the electric potential (hereinafter, referred to as a BL electric potential) of the bit line in accordance with discharge in the memory unit, in a case where the resistance to be sensed is high, the discharge of the BL electric potential at the time of an erase•verify operation is performed at a low speed. Accordingly, it is necessary to delay the sense timing. On the other hand, in a case where the resistance to be sensed is low, the discharge of the BL electric potential at the time of a write•verify operation is performed at a high speed. Accordingly, it is necessary to advance the sense timing. When the sense timing is late at the time of a write•verify operation, the BL electric charges disappear. Therefore, it is difficult to perform a normal sense operation.

As described above, an optimal sense timing differs in accordance with the logic of the information to be read out, which is not limited only to the case of the ReRAM. In other words, when a method in which the magnitude of the cell current is read out by performing dynamic discharge reading without controlling the voltage of the gate of the memory transistor is used, even in a non-volatile memory device such as a flash EEPROM other than the variable resistance-type memory, a lag in the optimal sense timing occurs.

Hereafter, a method of directly reading the discharge rate of the precharged electric charges without regulating the discharge current to be approximately constant (by using the voltage of the gate of the transistor or the like) is referred to as "dynamic discharge reading".

In the case of the dynamic discharge reading, when the optimal sense timing is controlled by a circuit that controls the activation timing of the sense amplifier, the complexity of the control circuit is increased.

Thus, it is desirable to provide a memory device, which is a non-volatile memory performing so-called dynamic discharge reading, including a configuration capable of generating a sense timing that does not cause any erroneous decision and a method of reading the memory device.

A memory device according to an embodiment of the present invention includes a memory unit, a sense amplifier, and a replica circuit.

The memory unit has an electric charge discharging rate between two electrodes that is different in accordance with the logic of the stored information.

The sense amplifier detects the logic of the information by comparing a discharge electric potential of a wiring to which one electrode of the memory unit is connected with a reference electric potential.

The replica circuit has a replica unit emulating the memory unit and controls a sense timing of the sense amplifier in accordance with a discharge rate of the replica unit.

According to the above-described configuration, since the replica unit emulates the memory unit, the discharge rates thereof are approximately the same. In addition, in accordance with the discharge rate of the replica unit, the sense timing of the sense amplifier that detects the logic of the memory unit is controlled. Accordingly, in a case where the replica unit and the memory unit are simultaneously discharged, the sense timing depends on a difference in the discharge rates of the memory units. Thus, when the discharge rate is high, the sense timing is also advanced. On the other hand, when the discharge rate is low, the sense timing is delayed as that much. In other words, the sense timing is automatically adjusted in accordance with the discharge rate.

A method of reading a memory device according to another embodiment of the present invention relates to reading out information from a memory unit in which an electric charge discharging rate between two electrodes is different in accordance with the logic of the stored information. In this method, when the reading out of the information is performed, a sense timing of a discharge electric potential of the memory unit is controlled in accordance with a discharge rate of a replica unit at a time when discharge of the replica unit emulating the memory unit is started simultaneously with discharge of the memory unit.

According to the embodiments of the present invention, there is provided the memory device, which is a non-volatile memory performing so-called dynamic discharge reading, including a configuration capable of generating a sense timing that does not cause any erroneous decision and the method of reading the memory device.

DESCRIPTION OF THE PREFERRED EMBODIMENTS

Embodiments of the present invention will be described with a ReRAM used as an example in the following order.

1. First Embodiment: Example of Memory Column Circuit and Replica Circuit That Perform Constant-Current Discharge.

2. Second Embodiment: Example of Memory Column Circuit and Replica Circuit That Perform Constant-Current Discharge and Charge Transition (Voltage Clamp Cutting Off Operation)

3. Modified Example: Simple Discharge Detecting Circuit Having Marked Application Effect of Embodiment of Invention <1. First Embodiment>

Figure 1A:
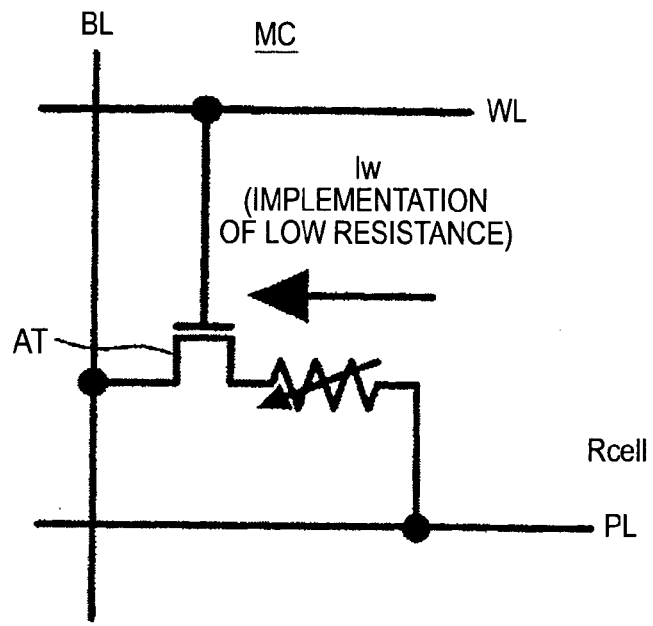
FIGS. 1A and 1B are equivalent circuit diagrams of a memory cell that is common to the embodiments and modified examples.
Figure 1B:
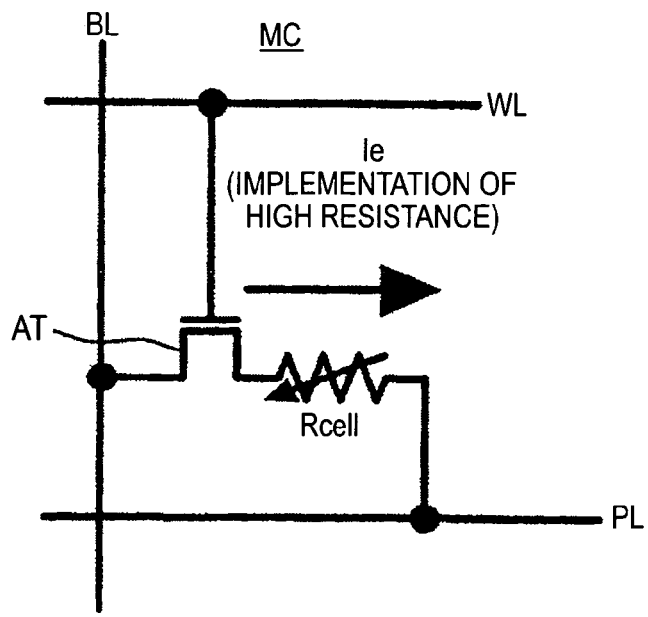

FIGS. 1A and 1B represent an equivalent circuit of a memory cell that is common to the embodiments of the present invention. FIGS. 1A and 1B represent the direction of a write current Iw and the direction of an erase current Ie. However, the configurations of the memory cells are the same in the figures.

A memory cell MC illustrated in FIGS. 1A and 1B has one memory cell resistor Rcell serving as a "memory unit" and one access transistor AT.

One end of the memory cell resistor Rcell is connected to a plate line PL, and the other end thereof is connected to the source of the access transistor AT. In addition, the drain of the access transistor AT is connected to a bit line BL, and the gate thereof is connected to a word line WL serving as an "access line".

In FIGS. 1A and 1B, the bit line BL and the plate line PL are represented to be orthogonal to each other. However, the bit line BL and the plate line PL may be disposed to be parallel to each other.

Figure 2:
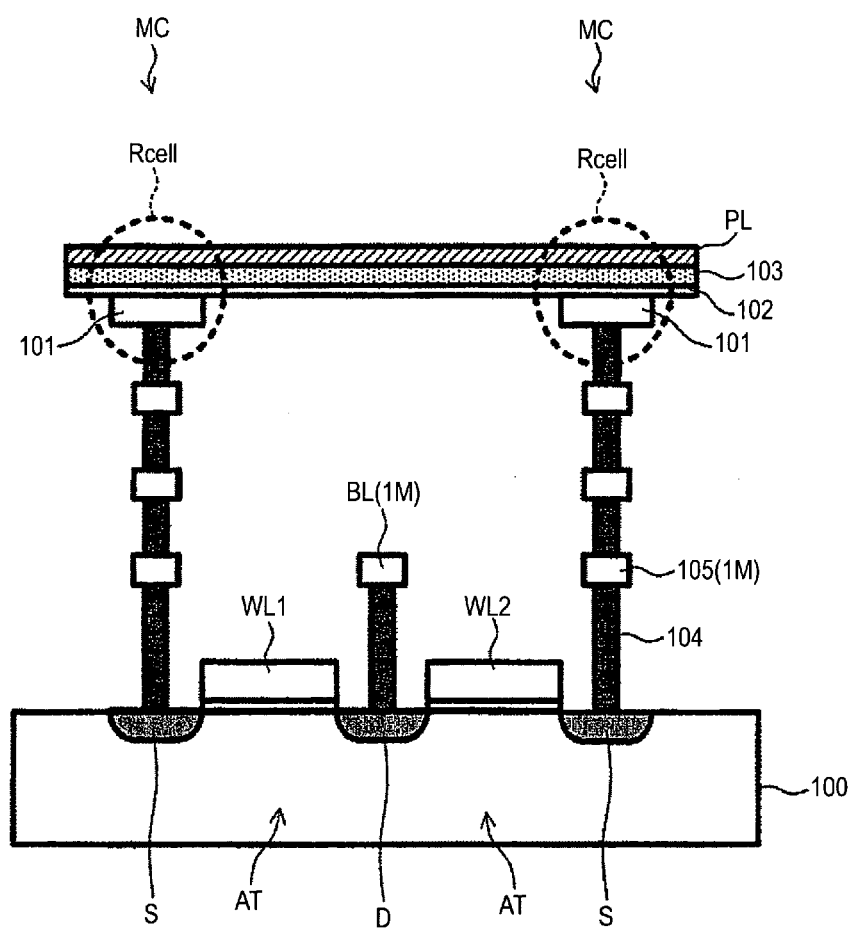
FIG. 2 is a cross-sectional view showing the structure of two adjacent memory cell portions of a device.

FIG. 2 represents the device structure of a portion corresponding to two adjacent memory cells MC. FIG. 2 is a schematic cross-sectional view, and hatched lines are not attached. A blank portion of FIG. 2, which is not particularly mentioned, is filled with an insulating film or configures another portion (a part thereof).

In each memory cell MC illustrated in FIG. 2, the access transistor AT is formed in a semiconductor substrate 100.

Described in detail, two impurity regions that become the source (S) and the drain (D) of the access transistor AT are formed in the semiconductor substrate 100, and a gate electrode formed from polysilicon or the like is formed through a gate insulating film on a substrate area disposed therebetween. Here, the gate electrode configures a word line WL1 or WL2.

The drain (D) is shared by the two memory cells MC and is connected to the bit line BL formed by a first wiring layer (1M).

On the source (S), a plug 104 and a landing pad 105 (formed from the wiring layer) are repeatedly stacked, and a memory cell resistor Rcell is formed thereon. The memory cell resistor Rcell maybe formed in any layer of the multiple-layer wiring structure. Here, the cell resistor Rcell is formed mostly on the fourth to fifth layers.

The memory cell resistor Rcell has a film configuration (laminated structure) having an insulating film 102 and a conductive film 103 between a lower electrode 101 and an upper electrode that becomes the plate line PL.

As examples of the material of the insulating film 102, there are SiN, $SiO_2$, $Gd_2O_3$, and the like.

As examples of the material of the conductive film 103, there are a metal film, an alloy film (for example, a CuTe alloy film), a metallic compound film, or the like that contains one or more metal elements selected from among Cu, Ag, and Zr. In addition, a metal element other than Cu, Ag, and Zr may be used as long as it has an easily-ionizable property. In addition, it is preferable that an element that is combined with at least one of Cu, Ag, and Zr is at least one of S, Se, and Te. The conductive film 103 is formed as an "ion supplying layer".

Figure 3A:
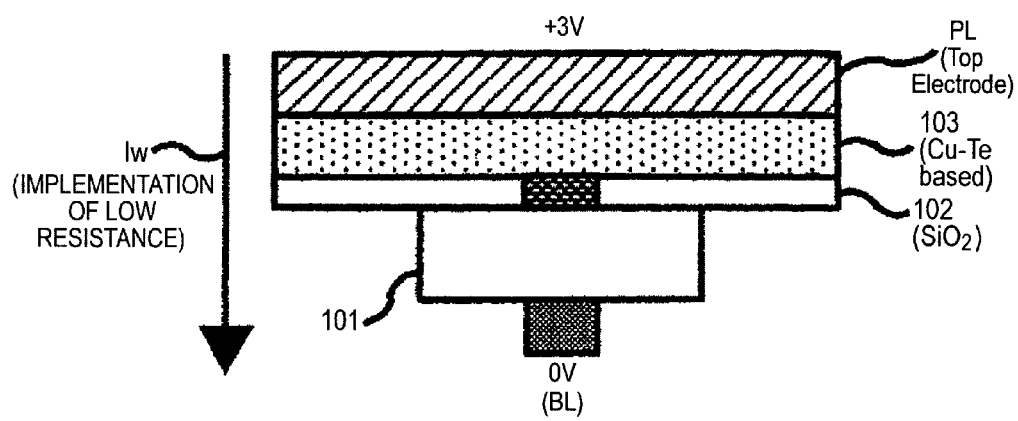
FIGS. 3A and 3B are diagrams representing a cross section and the operation of a variable cell resistor (memory unit).
Figure 3B:
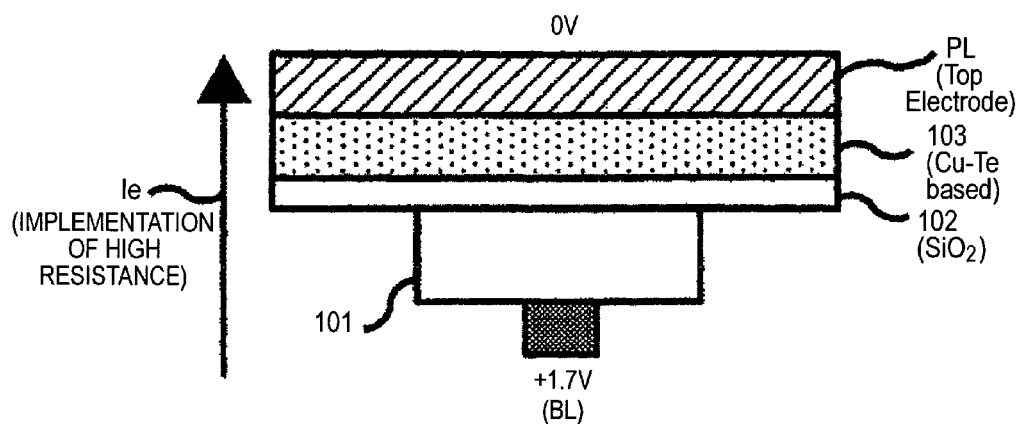

FIGS. 3A and 3B show enlarged views of the memory cell resistor Rcell to which examples of the direction of a current and applied voltage values are added.

FIGS. 3A and 3B show a case where the insulating film 102 is formed from $SiO_2$, and the conductive film 103 is formed from a CuTe alloy-based alloy compound (Cu—Te based) as an example.

As shown in FIG. 3A, a voltage having the insulating film 102 side as a cathode side and the conductive film 103 side as a positive side is applied between the lower electrode 101 and the upper electrode (the plate line PL). For example, the bit line BL is grounded as being 0 [V], and for example, +3 [V] is applied to the plate line PL.

Then, Cu, Ag, or Zr that is contained in the conductive film 103 is ionized so as have a property of being drawn to the cathode side. Conductive ions of the metal are injected into the insulating film 102. Accordingly, the insulating property of the insulating film 102 is degraded, and comes to have conductivity in accordance with the degradation. As a result, a write current Iw flows in the direction shown in FIG. 3A. This operation is referred to as write (operation) or set (operation).

In contrast to this case, as shown in FIG. 3B, a voltage having the insulating film 102 side as a positive side and the conductive film 103 side as a negative side is applied between the lower electrode 101 and the upper electrode (the plate line PL). For example, the plate line PL is grounded as being 0 [V], and for example, +1.7 [V] is applied to the bit line BL.

Then, the conductive ions injected into the insulating film 102 are returned back to the conductive film 103 so as to be reset to the state before the write in which the resistance value is high. This operation is referred to as erase (operation) or reset (operation). In the reset state, an erase current Ie flows in the direction shown in FIG. 3B.

Hereinafter, setting represents "sufficiently injecting the conductive ions into the insulating film", and resetting represents "sufficiently extracting the conductive ions from the insulating film".

On the other hand, the state (set or reset) of being a write state of data and the state of being an erase state of data are arbitrarily defined.

In the description below, a case where the insulating property of the insulating film 102 is degraded, and the resistance value of the entire memory cell resistor Rcell decreases up to a sufficient level corresponds to "write" (set) of data. In contrast, a case where the insulating property of the insulating film 102 is returned back to the original initial state, and the resistance value of the entire memory cell resistor Rcell increases up to a sufficient level corresponds to "erase" (reset) of data.

Here, the direction of an arrow included in the circuit symbol of the memory cell resistor Rcell shown in FIGS. 1A and 1B, generally, is the same as that of the current at the time of setting (here, at the time of writing).

By repeating the setting and the resetting that are described above, a binary memory that reversibly changes the resistance value of the memory cell resistor Rcell between a high resistance state and a low resistance state is implemented. In addition, the memory cell resistor Rcell maintains data even when application of a voltage is stopped, whereby serving as a non-volatile memory.

At the time of setting, actually, the resistance value of the insulating film 102 changes in accordance with the amount of the metal ions included in the insulating film 102. Accordingly, the insulating film 102 can be regarded as a "memory layer" in which data is stored and maintained.

By configuring a memory cell by using the memory cell resistor Rcell and disposing a plurality of the memory cells, a memory cell array of a variable resistance-type memory can be configured. The variable resistance-type memory is configured by the memory cell array and a driving circuit (peripheral circuit).

[Configuration of IC Chip]

Figure 4:
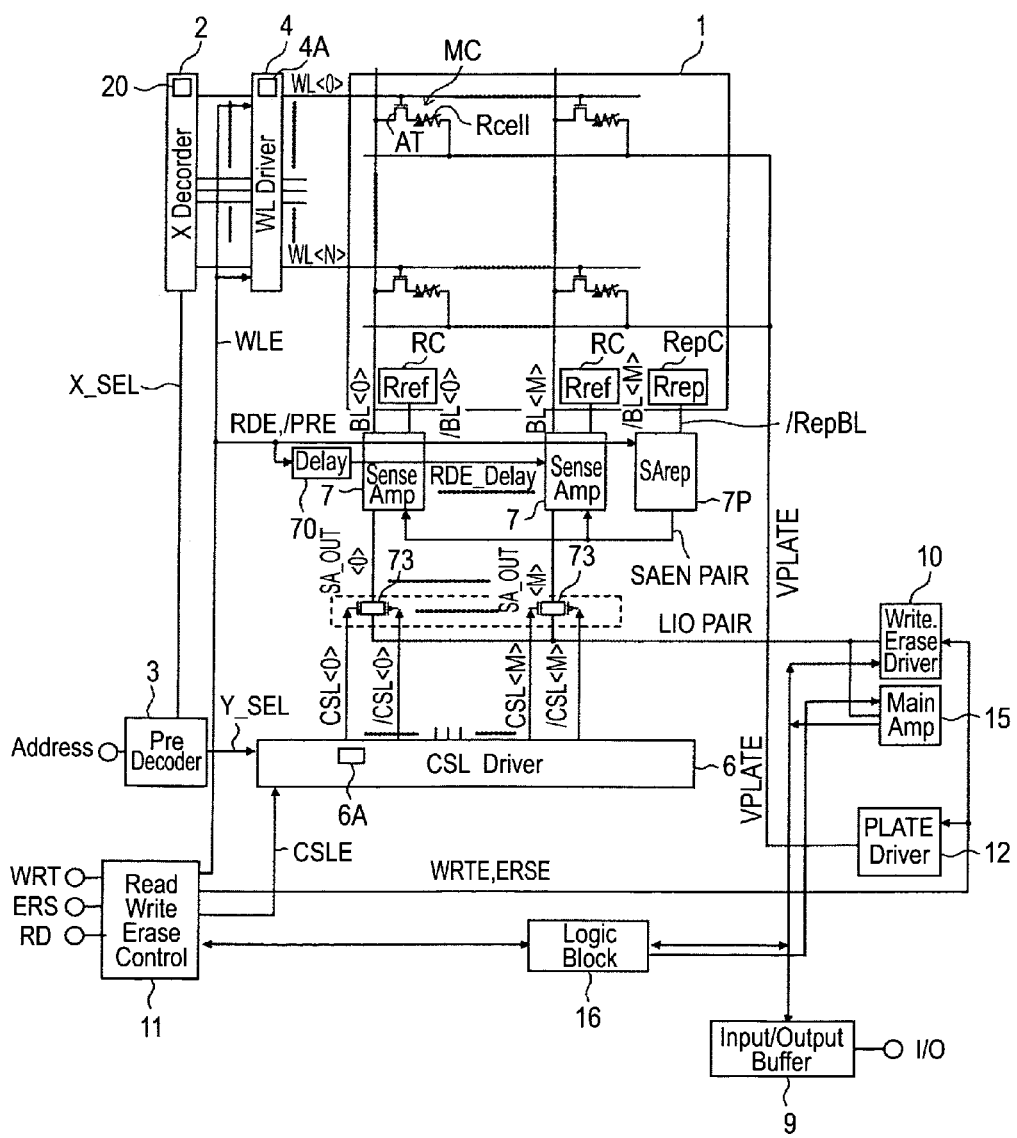
FIG. 4 is a block diagram of an IC chip (memory device) that is common to embodiments.

FIG. 4 shows a block diagram of an IC chip.

The illustrated semiconductor memory device has a memory cell array 1 in which (M+1) memory cells MC shown in FIGS. 1A to 3B are disposed in the row direction, and (N+1) memory cells MC are disposed in the column direction, so as to form a matrix pattern. The semiconductor memory device is acquired by integrating the memory cell array 1 and the peripheral circuit thereof in the same semiconductor chip. Here, "N" and "M" are natural numbers that are relatively large, and specific values thereof are arbitrarily set.

In the memory cell array 1, (N+1) word lines WL<0> to WL<N> that connect in common the (M+1) memory cells MC aligned in the row direction and the gates of access transistors AT are disposed at a predetermined interval in the column direction. In addition, (M+1) bit lines BL<0> to BL<M> that connect in common the (N+1) memory cells MC aligned in the column direction and the drains of the access transistors AT are disposed at a predetermined interval in the row direction.

In addition, (N+1) plate lines PL that connect in common the access transistors AT of the memory cell resistors Rcell and nodes disposed on the opposite sides thereof in the row direction are disposed at a predetermined interval in the column direction. One ends of the (N+1) plate lines PL are configured to be common and appear on the outside of the memory cell array 1.

Alternatively, (M+1) plate lines PL may longitudinally disposed in the column direction.

The peripheral circuit, as shown in FIG. 4, includes an X (address) decoder (X decoder) 2, a pre-decoder (PRE Decoder) 3 that also serves as a Y (address) decoder, a WL driver 4, an SAIO switch 73, and a CSW driver 6. In addition, the peripheral circuit includes a sense amplifier (Sense Amp) 7, a main amplifier (Main Amp) 15, and an I/O buffer (Input/Output Buffer) 9 for each column. Furthermore, the peripheral circuit includes a write•erase driver (Write•Erase Driver) 10, a control circuit 11, a plate driver (PLATE Driver) 12, and a logic block 16.

A circuit that generates various voltages based on a power source voltage, a clock signal generating control circuit, and the like are not shown in FIG. 4.

The X decoder 2 is configured by using an X selector (not shown in the figure) as its basic unit. The X decoder 2 is a circuit that decodes an X address signal input from the pre-decoder 3 and transmits an X select signal X_SEL selected based on the decoding result to the WL driver 4. The X selector will be described later in detail.

The pre-decoder 3 divides the input address signal (Address) into an X address signal and a Y address signal. The pre-decoder 3 transmits the X address signal X_SEL to the X decoder 2 and decodes the Y address signal by using a Y decoding unit.

The Y decoding unit of the pre-decoder 3 is configured by a Y selector (not shown in the figure) as its basic unit. The pre-decoder 3 is a circuit that decodes the input Y address signal and a Y select signal Y_SEL selected based on the decoding result to the CSW driver 6. The Y selector will be described later in detail.

The WL driver 4 includes (N+1) WL driver units (not shown in the figure) for the word lines WL. To the output of each WL driver unit, one corresponding word line amongst the (N+1) word lines WL<0> to WL<N> is connected. One WL driver unit is selected in accordance with the X select signal X_SEL that is input from the X decoder 2. The WL driver unit is a circuit that applies a predetermined voltage to the word line WL connected to the output thereof when being selected. The WL driver unit will be described later in detail.

The CSW driver 6 is configured by a CSW driver unit as its basic unit. The CSW driver 6 is a circuit that drives column selection lines CSL<0> to CSL<M> as wirings used for controlling the SAIO switch 73. The CSW driver unit will be described later in detail.

The SAIO switch 73, for example, is configured by a single NMOS transistor (or a PMOS transistor) or a transfer gate shown in FIG. 4. Here, there are a total of (M+1) SAIO switches 73 each connected to a sense input/output line SIOL of a respective sense amplifier 7. The connection or disconnection between the sense input/output line SIOL and a pair of local input/output lines (LIO and /LIO) is controlled by the SAIO switch 73.

Hereinafter, each switch configuring the SAIO switch 73 is assumed to be a transfer gate.

To the pair of the local input/output lines (LIO and /LIO), a write erase driver 10 and the main amplifier 15 are connected.

The main amplifier 15 is a circuit that is used for amplifying memory cell data read out by the sense amplifier 7 and outputting the memory cell data to an external I/O bus through the I/O buffer 9.

The write erase driver 10 is connected to the I/O buffer 9. The write erase driver 10 receives data, which is transmitted from the outside, from the I/O buffer 9 as input and controls the sense amplifier 7 such that the data maintained in the sense amplifier 7 can be changed in accordance with the input data.

The sense amplifier 7 is connected between a pair of bit lines (BL and /BL) of the memory cell array 1 and the SAIO switch 73. The sense amplifier 7 is a differential sense amplifier that compares a change in the electric potential of the bit line BL input from the sense input/output line SIOL through the SAIO switch 73, which is in the On state, with the electric potential of the complement bit line (/BL).

The control circuit 11 receives a write enable signal WRT, an erase enable signal ERS, and a data read signal RD as input and operates based on the three signals.

The control circuit 11 has the following six functions.

(1) a function of controlling a sense operation by supplying a read enable signal RDE and a precharge signal (/PRE) to the sense amplifier 7 and the like In this embodiment, the read enable signal RDE is used only for directing the start of BL discharge, which will be described later, and an actual sense operation (activation of the sense amplifier) is indirectly controlled through a replica system circuit that operates based on the read enable signal RDE.

(2) a function of controlling word lines by providing each WL driver unit disposed inside the WL driver 4 with a WL selection enable signal WLE (3) a function of individually allowing the SAIO switches 73 to be conductive or non-conductive by controlling the CSW driver 6 through the pre-decoder 3 (or directly)

(4) a function of controlling supply of an operation voltage by providing the write erase driver 10 with a write enable signal WRT or an erase enable signal ERS at the time of writing or erasing data (5) a function of controlling supply of an operation voltage by providing the plate driver 12 with a write enable signal WRT or an erase enable signal ERS as is necessary at the time of writing or erasing data (6) a function of setting initial data of inhibit control by controlling the logic block 16 at the time of a verify operation Only reference signs of various control signals that are output by the control circuit 11 are shown in FIG. 4, and detailed changes in the level will be described later.

[Replica System Circuit]

In this embodiment, in addition to the above-described configuration, a circuit used for a replica operation is added.

As shown in FIG. 4, one replica sense amplifier (SArep) 7P is disposed so as to be connected to (M+1) sense amplifiers 7 in parallel. In addition, to the sense amplifier 7 and the replica sense amplifier 7P, the read enable signal RDE and the precharge signal (/PRE) are supplied from the control circuit 11.

Of these signals, the read enable signal RDE can be supplied to the sense amplifier 7 as a delayed output (RDE_Delay) through the delay circuit (Delay) 70.

As a sensing target of the replica sense amplifier 7P, a replica cell RepC that emulates the memory cell MC is disposed inside the memory cell array 1.

In addition, in this embodiment, a reference cell RC, which is not a replica system circuit, applying a reference electric potential is disposed for each column of the memory cell array for conditioning the differential type of the sense amplifier 7. Both the reference cell RC and the replica cell RepC basically emulate the memory cell MC. However, as in other embodiments to be described later, the resistance value of the replica cell RepC side may be changeable. In such a case, the reference cell RC and the replica cell RepC are functionally different from the memory cell MC, and are termed as the reference cell and the replica cell.

A "replica circuit" according to an embodiment of the present invention is configured so as to include the replica sense amplifier 7P and a replica cell resistor Rrep disposed inside the replica cell RepC.

The function and the operation of the replica system circuits and the added cell will be described later.

[Control System Circuit]

Next, the X selector that is a basic configuration of the X decoder 2 and the Y selector that is a basic configuration of the Y decoder function of the pre-decoder 3 will be described. Subsequently, the WL driver unit that is a basic configuration of the WL driver 4 will be described.

Figure 5:
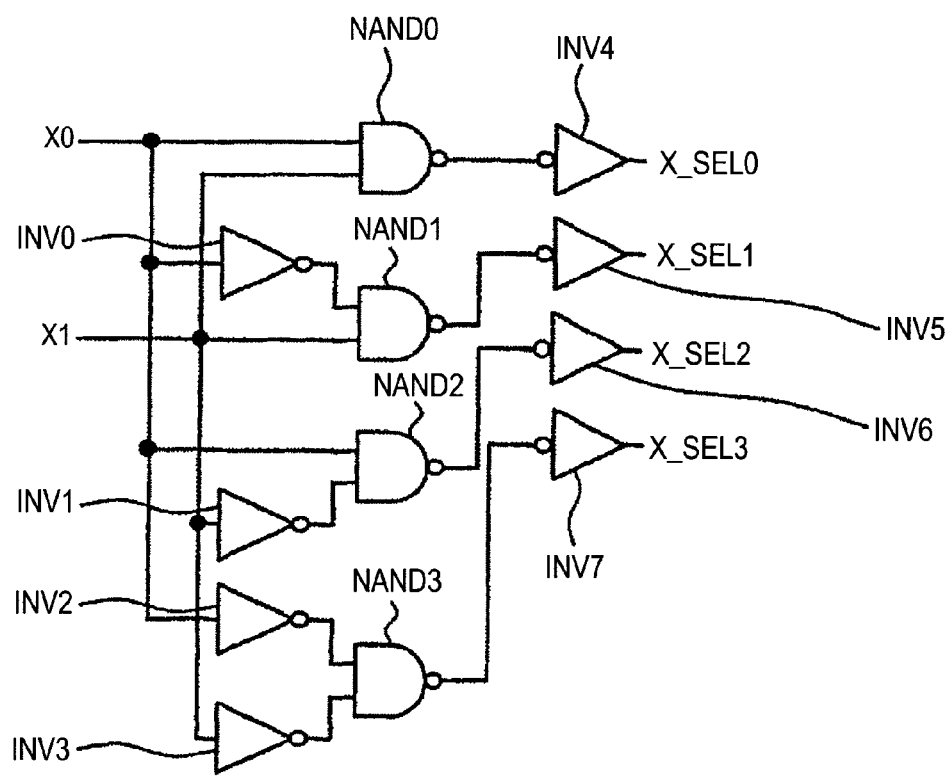
FIG. 5 is a circuit diagram of an X selector.

FIG. 5 shows an example of the circuit of the X selector 20.

The X selector 20 illustrated in FIG. 5 is configured by four inverters INV0 to INV3 disposed on the former stage, four NAND circuits NAND0 to NAND3 disposed on the intermediate stage, and other four inverters INV4 to INV7 connected on the latter stage.

The X selector 20 is a circuit that receives X address bits X0 and X1 as input and activates (for example, sets a high level to) any one of X select signals X_SEL0 to X-SEL3 in accordance with the decoding result.

FIG. 5 is an example of two-bit decoding. However, the X decoder 2 can be implemented so as to respond to an input of bits other than two bits by expanding or developing into multiple stages the configuration shown in FIG. 5 in accordance with the number of bits of the input X address signal.

Figure 6:
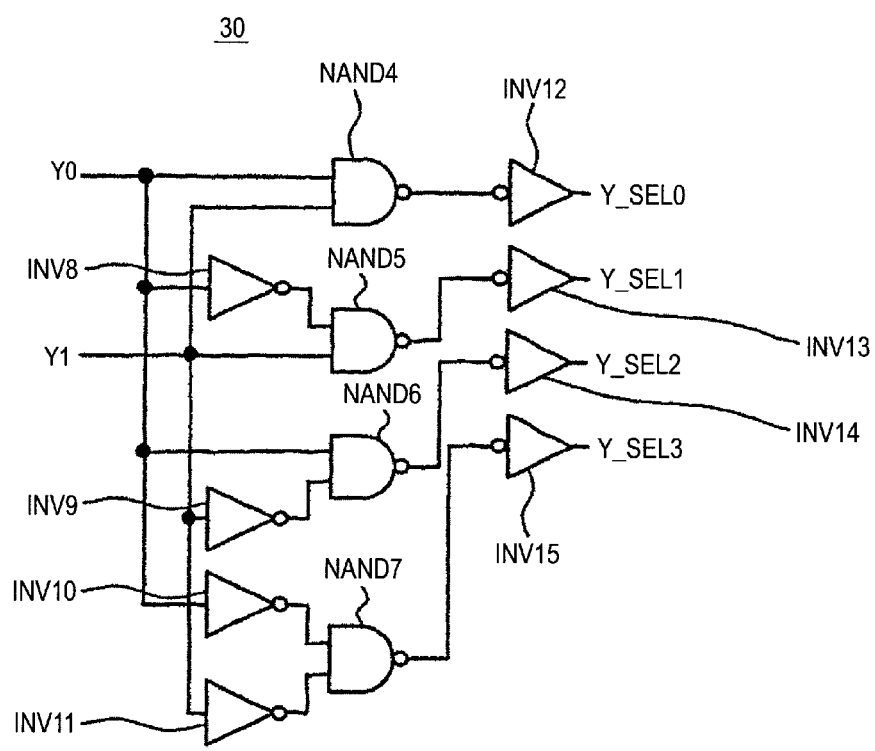
FIG. 6 is a circuit diagram of a Y selector.

FIG. 6 shows an example of the circuit of the Y selector 30.

The illustrated Y selector 30 is configured by four inverters INV8 to INV11 disposed on the former stage, four NAND circuits NAND4 to NAND7 disposed on the intermediate stage, and other four inverters INV12 to INV15 connected on the latter stage.

The Y selector 30 is a circuit that receives Y address bits Y0 and Y1 as input and activates (for example, sets a high level to) any one of Y select signals Y_SEL0 to Y-SEL3 in accordance with the decoding result.

FIG. 6 is an example of two-bit decoding. However, the pre-decoder 3 can be implemented so as to respond to an input of bits other than two bits by expanding or developing into multiple stages the configuration shown in FIG. 6 in accordance with the number of bits of the input Y address signal.

Figure 7:
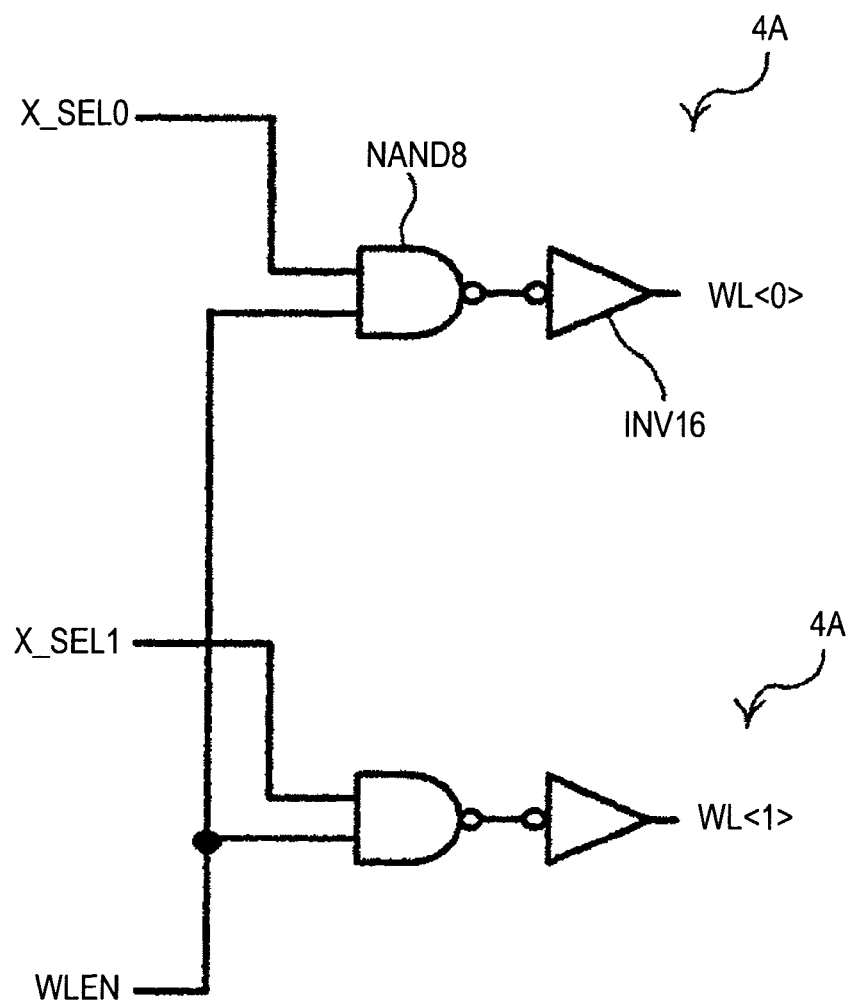
FIG. 7 is a circuit diagram showing two WL driver units.

FIG. 7 is a circuit diagram showing two WL driver units 4A.

The number of the illustrated WL driver units 4A that are disposed is the same as the number (N+1) of cells disposed inside the WL driver 4 in the column direction.

These (N+1) WL driver units 4A operate in accordance with one X select signal X_SEL0 or XSEL1 that is selected (activated) by the X selector 20 shown in FIG. 5 or the like. The WL driver unit 4A activates one of the word lines WL<0> and WL<1> according to the X select signal X_SEL0 or XSEL1.

The WL driver unit 4A illustrated in FIG. 7 is configured by a NAND circuit NAND8 and an inverter INV16.

The WL selection enable signal WLE is input to one input of the NAND circuit NAND8, and the X select signal X_SEL0 or X_SEL1 is input to the other input thereof. In addition, the output of the NAND circuit NAND8 is connected to the input of the inverter INV16. The word line WL<0> or WL<1> that is connected to the output of the inverter INV16 is activated or inactivated.

The WL selection enable signal WLE shown in FIG. 7 is generated by the control circuit 11 shown in FIG. 4 and is supplied to the row decoder 4.

Figure 8:
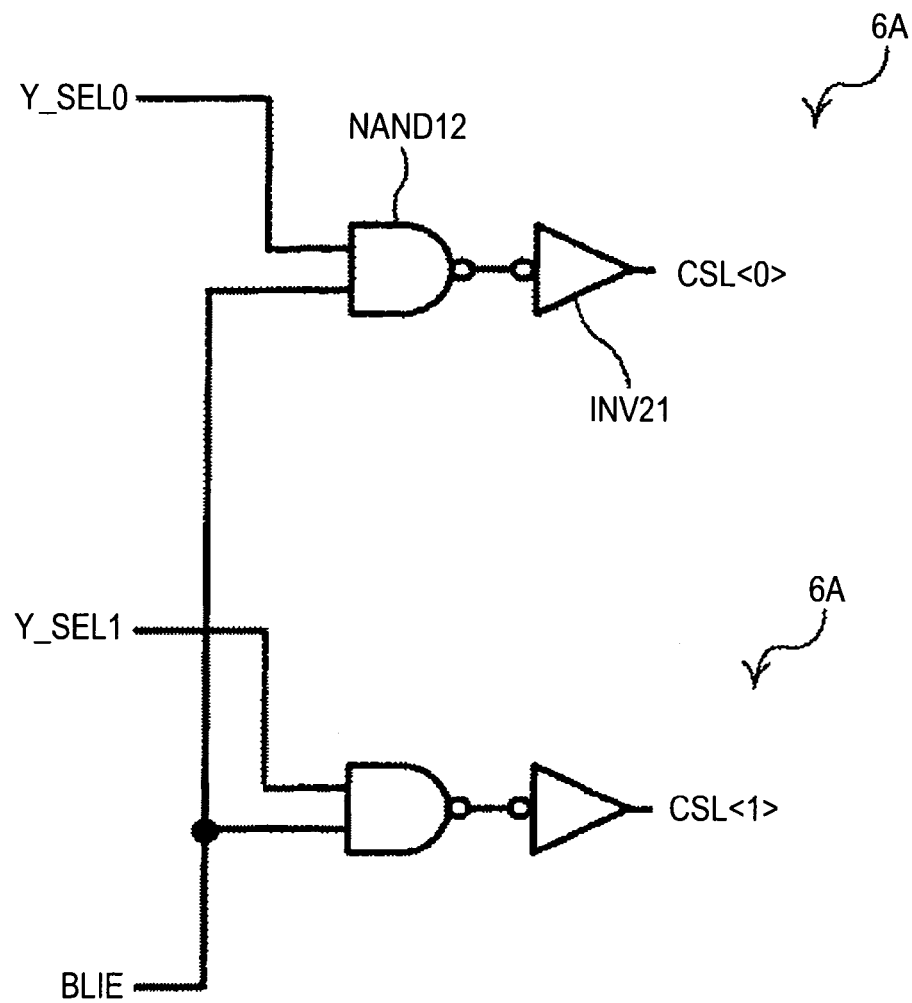
FIG. 8 is a circuit diagram of a CSW driver unit.

FIG. 8 shows an example of a circuit corresponding to two CSL driver units 6A.

The illustrated CSL driver unit 6A is configured by a NAND circuit NAND12 and an inverter INV21 that is connected to the output thereof.

A BLI enable signal BLIE is input to one input of the NAND circuit NAND12, and one Y select signal Y_SEL0 or Y_SEL1 that is selected (activated) by the Y selector 30 shown in FIG. 6 is input to the other input thereof. When the Y select signal Y_SEL0 or Y_SEL1 and the BLI enable signal BLIE are activated (set to a high level) together, the output of the NAND circuit NAND12 is in a low level. Accordingly, the electric potential of the column selection line CSL<0> or CSL<1> that is connected to the output of the inverter INV21 transits to an activated level (in this example, a high level).

The electric potential of the column selection line CSL<0> or CSL<1>, as shown in FIG. 4, is connected to the gate of the corresponding NMOS transistor 72.

The BLI enable signal BLIE shown in FIG. 8 is generated by the control circuit 11 shown in FIG. 4 and is supplied to the CSW driver 6.

[Detailed Configuration Example of Column Circuit and Replica System Circuit]

Figure 9:
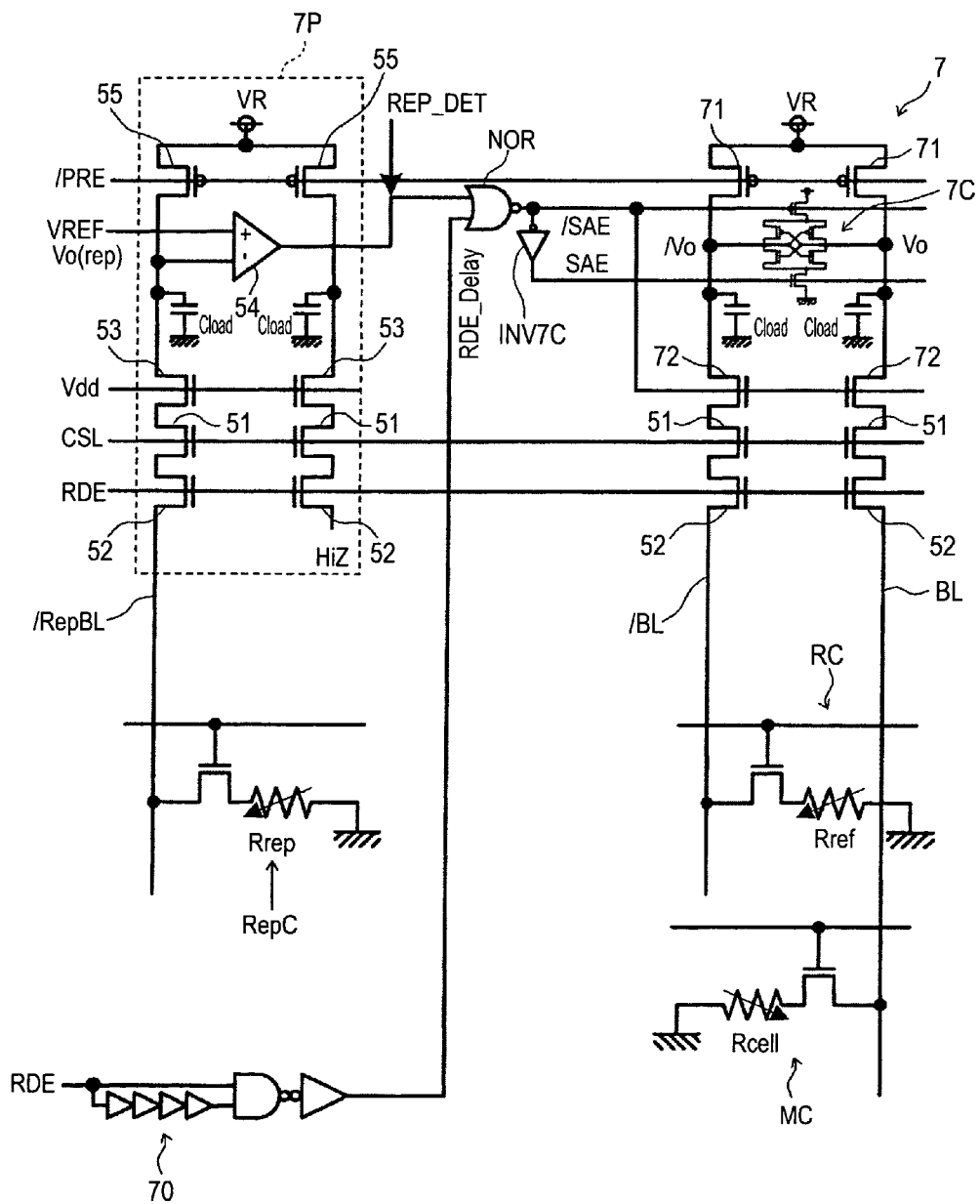
FIG. 9 is a circuit diagram representing a configuration example of a replica system circuit according to the first embodiment together with a memory column.

FIG. 9 represents a configuration example of a replica system circuit according to this embodiment together with a memory column.

The configuration illustrated 9 shows a case where the sense amplifier is a differential type (also termed a cross-coupled latch type) as an application example of an embodiment of the present invention. However, the sense amplifier may be a signal end type.

The differential-type sense amplifier 7 includes one PMOS transistor 71 that controls supply of a read BL voltage VR in addition to a core circuit 7C that has a configuration equivalent to a general configuration. In addition, this sense amplifier 7 includes an NMOS transistor 72 that controls the connections of the sense node (electric potential: Vo) and the reference sense node (electric potential: /Vo) with the pair of the bit lines (BL and /BL).

Here, the core circuit 7C represents a configuration that has a latch circuit and a pair of PMOS and NMOS transistors for activation.

The NMOS transistor 72 operates as a constant-current transistor. In other words, the NMOS transistor 72 controls the flow of a constant current by performing an ON-operation in a strong inversion region. The NMOS transistor 72 may be omitted. However, when the NMOS transistor 72 is disposed, a discharge curve becomes close to a straight line having a negative slope, and accordingly, there is an advantage in that the setting of determination on the reference voltage can be easily estimated. Accordingly, this configuration in which the NMOS transistor 72 operates as a constant-current source is preferable.

The memory cell MC is connected to the bit line BL, and the reference cell RC is connected to the complement bit line (/BL). Here, a variable resistor of the reference cell RC is referred to as a reference cell resistor Rref.

The replica cell RepC included in a "replica circuit" according to an embodiment of the present invention includes a "replica unit" that emulates the memory cell resistor Rcell together with the reference cell resistor Rref. The replica unit is a replica resistor Rrep. The replica resistor Rrep is connected to a replica bit line (/RepBL) through an access transistor.

A replica sense node (electric potential: Vo(rep)) of the "discharge detecting unit" can be connected to the replica bit line (/RepBL) through a plurality of transistors.

In particular, the discharge detecting unit here includes a differential amplifier 54 as an example of a "comparator circuit", and the inverted input "−" of the differential amplifier 54 becomes a replica sense node. In addition, to the non-inverted input "+" of the differential amplifier 54, for example, a discharge determining reference electric potential VREF can be applied from the control circuit 11 shown, in FIG. 4.

In order to supply the read-out BL voltage VR to the replica sense node, a PMOS transistor 55 driven in accordance with the precharge signal (/PRE) is disposed together with the PMOS transistor 71 disposed inside the sense amplifier 7.

In FIG. 9, the equivalent load capacitance of the replica sense node and the equivalent load capacitance of the pair of the sense nodes are denoted by a reference sign "Cload".

Similarly to the NMOS transistor 72 disposed on the sense amplifier 7 side, an NMOS transistor 53 serving as a constant-current transistor is connected between the replica sense node and the replica bit line (/RepBL). The gate of the NMOS transistor 53, for example, is controlled in accordance with a power source voltage Vdd.

Between the constant-current transistor and the replica bit line (/RepBL), two NMOS switches 51 and 52 are connected in series.

This configuration is the same in the pair of the bit lines disposed on the sense amplifier side 7.

The NMOS switch 51 disposed on the replica BL side, the NMOS switch 51 disposed on the bit line BL side, and the NMOS switch 51 disposed on the complement bit line (/BL) side are controlled by the same column selection line CSL and serve as column switches.

The NMOS switch 52 disposed on the replica BL side, the NMOS switch 52 disposed on the bit line BL side, and the NMOS switch 52 disposed on the complement bit line (/BL) side are controlled in accordance with the read enable signal RDE and serve as "discharge starting switches" according to an embodiment of the present invention.

In addition, to the replica sense amplifier 7P, one set of three NMOS switches 51 to 53 and the PMOS transistor 55 is additionally disposed. However, the front end of the serial path of the set is open (high impedance HiZ). These four transistors may be omitted. The four transistors are disposed in order to uniformize the application of the control signal by having the same configuration as that of the sense amplifier side.

The replica circuit has a delay circuit 70, a NOR circuit NOR, and an inverter INV7C as an "activation control unit" in addition to the differential amplifier 54 disposed inside the replica sense amplifier 7P.

To one input of the NOR circuit NOR, the output of the differential amplifier 54 is connected, and to the other input of the NOR circuit NOR, the output of the delay circuit 70 is connected.

The delay circuit 70, for example, can be configured by logical devices as shown in the figure. To the input of the delay circuit 70, a read enable signal RDE is applied.

An activation PMOS of the core circuit 7C is controlled in accordance with the output of the NOR circuit, and an activation NMOS of the core circuit 7C is controlled in accordance with the inverted output of the inverter INV7C. These activation signals are referred to as an SAenable inverted signal (/SAE) and an SAenable signal SAE.

[Sense Operation (Reading Method)]

On the premise of the above-described configuration, a reading method according to this embodiment will be described.

Figure 10:
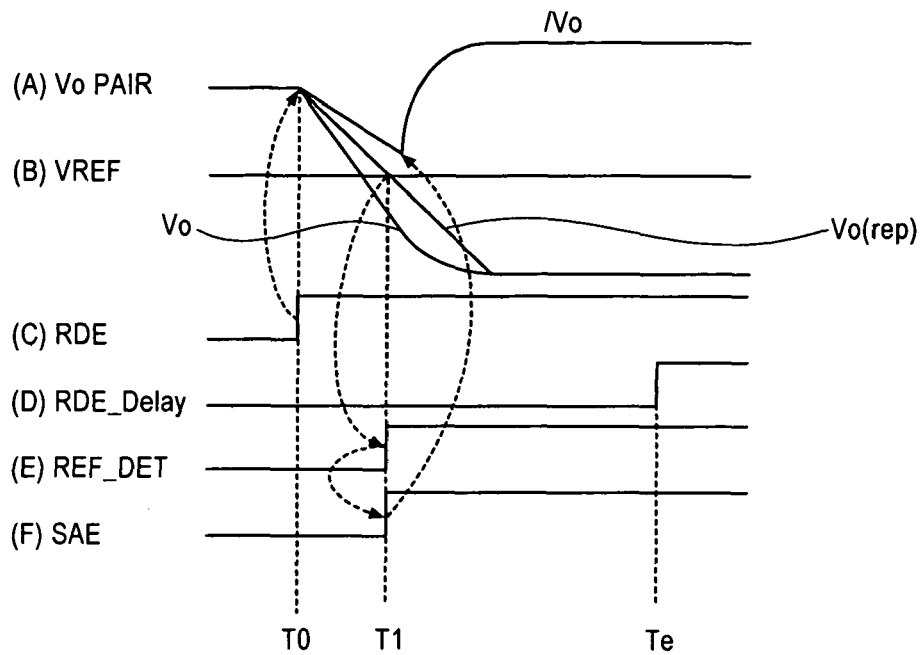
FIG. 10 shows operation waveform diagrams for a low-resistance read operation according to the first embodiment.

FIG. 10 shows operation waveform diagrams at a time when the reference resistor has low resistance (at the time of write•verify). In the description below, electric potential and the like will be denoted by simplified notations using reference signs.

At time T0, when the read enable signal RDE shown in (C) in FIG. 10 is turned on, a plurality of NMOS switches 52 are turned on altogether. Then, discharge of electric charges of the read BL voltage VR charged in the PMOS transistors 71 and 55 in advance is started by the memory cell MC, the reference cell RC, and the replica cell RepC all together. Simultaneously with the start of the sense operation (RDE is turned On), delay is started by the delay circuit 70.

At time T1, when the electric potential of the replica sense node (Vo(rep)) becomes the VREF electric potential, a replica output (REP_DET) is generated in accordance with the inverted output of the differential amplifier 54, and the replica output is applied to one input of the NOR circuit NOR. At the time point when the replica output (REP_DET) is generated, the delay output (RDE_Delay) of the delay circuit 70 is not turned on. The delay output (RDE_Delay) is turned on at time Te that is determined based on the delay amount of the delay circuit 70.

Accordingly, the output of the NOR circuit NOR becomes "L" together with the generation of the replica output (REP_DET), the SAenable inverted signal (/SAE) becomes the activation level, and the SAenable signal SAE becomes the activation level in accordance with the inverted signal. Accordingly, the sense amplifier 7 (the core circuit 7C) is activated at time T1 (before Te).

This operation waveform diagram represents a case where the memory cell has low resistance. Thus, the sense node electric potential Vo is below VREF before the activation (T1) of the sense amplifier. Accordingly, the sense amplifier performs an inversion operation for large-amplitude amplification in accordance with an electric potential difference between the reference node (/Vo) and the sense node electric potential (Vo).

Figure 11:
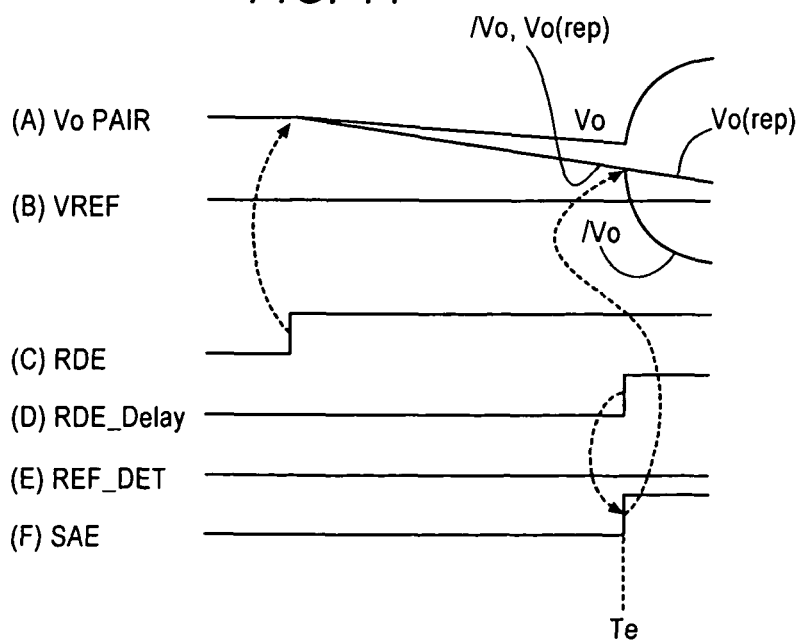
FIG. 11 shows operation waveform diagrams for a high-resistance read operation according to the first embodiment.

FIG. 11 shows operation waveform diagrams for the case of high resistance (at the time of an erase•verify operation) in which the discharge rate is low.

Simultaneously with turning on the signal RDE, discharge of the replica node electric potential (/Vo (rep)) and discharge of the sense node electric potential (Vo) through the memory cell are started. Simultaneously, delay of the RED signal is started in the delay circuit 70.

Since the replica resistor has high resistance, the delay output (RDE_Delay) rises before the generation of the replica output (REP_DET). Accordingly, sense amplifier activation signals (SAE and /SAE) are generated and are transmitted to the sense amplifier 7. In accordance with the rise of the sense amplifier activation signals (SAE and /SAE), the electric potential difference between the electric potentials (Vo and /Vo), in which the pair of the sense node electric potentials (Vo and /Vo) becomes the cross-coupled latch-type SA configuration, is amplified. At this time, since a high-resistance read operation is performed, a decrease in the (Vo) electric potential is slow, and the inversion operation of the electric potentials (Vo and /Vo) of the pair of the sense nodes is not generated.

The first embodiment uses a method in which the memory cell is sensed to be output by the complementary BL discharge operations of the reference resistor and the memory cell resistor Rcell. At this time, the memory cell is discharged through resistance that is the same as that of the replica resistor.

In such a circuit, even when the VREF electric potential is changed in accordance with noise or the like, the activation timing of the sense amplifier is changed in accordance with the change in the VREF electric potential. Accordingly, a malfunction can be prevented.

Accordingly, it is preferable that the VREF electric potential that becomes a reference for replica detection is set to a voltage that is lower than the VR electric potential to some degree such that the sensitivity for a variance such as noise is lowered.

When the VREF electric potential is lowered, the VREF noise sensitivity is lowered so as to operate in a stable manner, but the high-resistance detecting timing is delayed. As a countermeasure thereof, a timing control path using the delay circuit 70 is arranged from the start of the sense operation.

Next, the characteristics of the operation according to the first embodiment will be described in a quantitative manner.

Here, addition of the BL capacitive load to the sense node electric potential Vo is represented by load capacitance Cload. This load capacitance is almost the same in the reference BL and the replica BL.

In such a case, the Vo electric potential at a time when the electric charges of the load capacitor Cload are dynamically discharged in ReRAM (resistor) is represented as the following Equation (1).

$$Vo = VR * \mathrm{Exp}\{-\mathrm{Time}/(Rcell * Cload)\} \qquad (1)$$

Here, Time denotes a discharge time.

For example, it is assumed that Rcell (at the time of write•verify•read operation)=10 [KΩ], Rcell (at the time of an ordinary read operation)=100 [KΩ], and Rcell (erase•verify•read operation)=1 [MΩ]. In addition, the load capacitance Cload=100 [fF] is fixed as a constant, and it is revised such that VR=0.3 [V], VREF=0.15 [V], and the replica delay limit (the delay amount of the delay circuit 70)=30 [ns].

Figure 12:
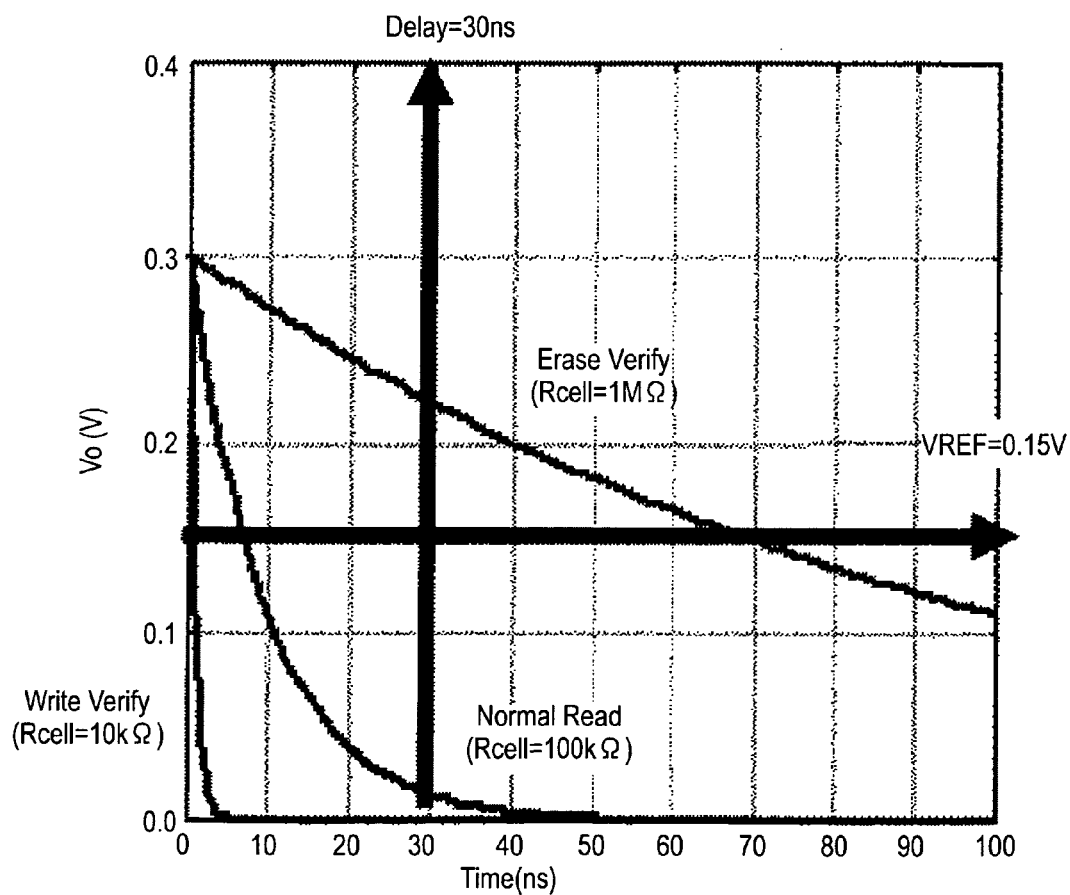
FIG. 12 is a diagram of calculated discharge characteristics representing the relationship between the delay amount and the discharge detection reference voltage.

FIG. 12 represents a discharge curve that is acquired by calculating the relationship between the Vo electric potential and the sense timing under the above-described assumption.

It can be known that, at the time of a low-resistance read operation (at the time of a write•verify operation) and an intermediate-resistance read operation (at the time of an ordinary read operation), REP-DET is turned on before the delay amount (30 [ns]) of the RDE_Delay for RED elapses.

On the other hand, it can be known that, at the time of a high-resistance read operation (at the time of erase•verify), the delay time of 30 [ns] elapses before REP_DET is turned on.

<2. Second Embodiment>

Figure 13:
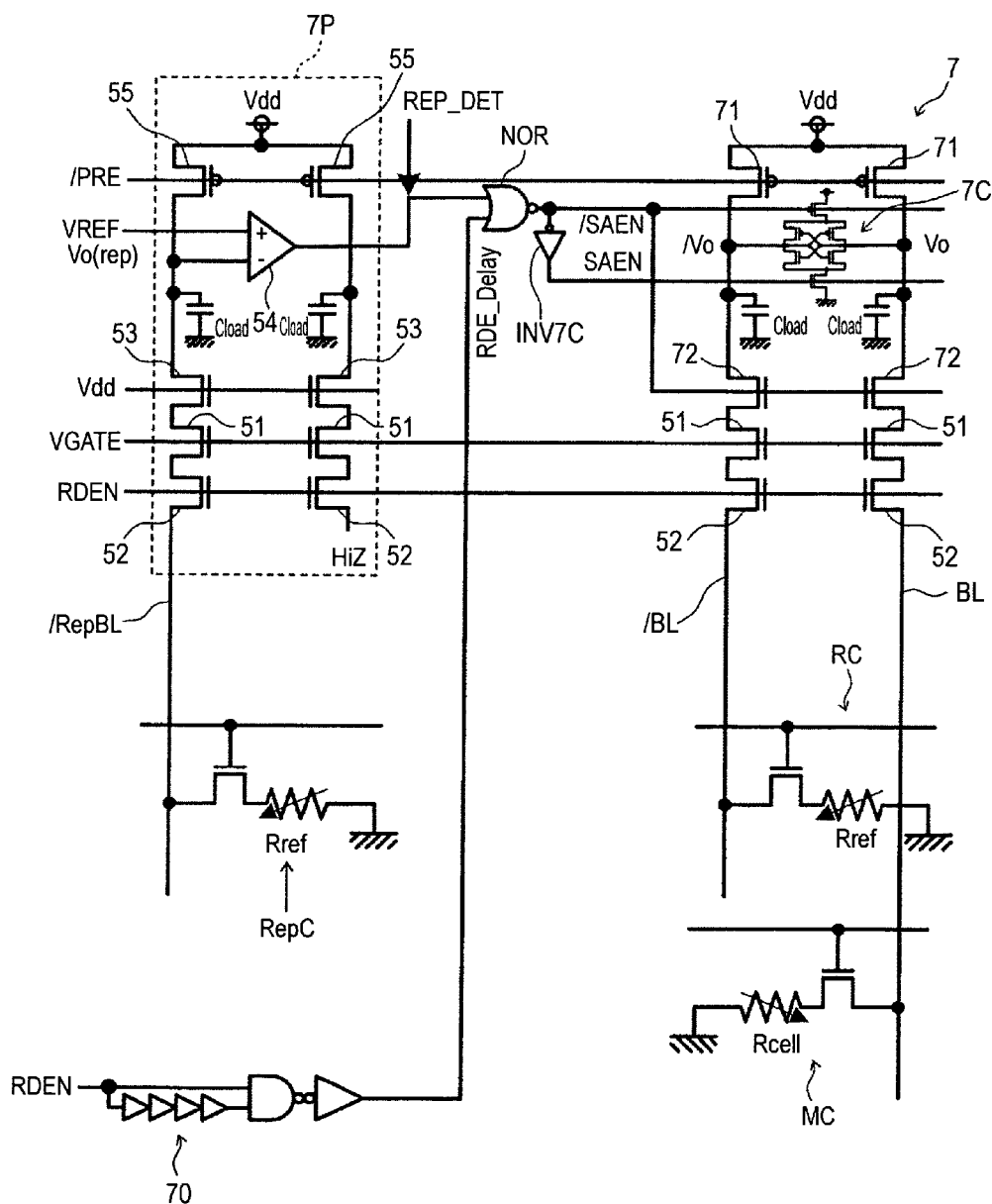
FIG. 13 is a circuit diagram representing a configuration example of a replica system circuit according to the second embodiment together with a memory column.

FIG. 13 is a circuit diagram corresponding to FIG. 9 of the second embodiment.

A difference between FIG. 13 and FIG. 9 is that the voltage applied to the gate of the NMOS switch 51 is changed to a voltage VGATE as a "clamp voltage" through the column selection line CSL. In addition, this voltage VGATE is a signal synchronized with the column selection line CSL and has the function of selecting a column.

Accordingly, the BL electric potential is clamped at an electric potential of {VGATE-Vgs (=VR)}.

One characteristic of this type of system is that a sense voltage having a large amplitude is applied to the sense node Vo side before the sense amplifier activation signals (SAE and /SAE) are turned on by fixing the BL electric potential. Regarding this point, in the first embodiment, the amplitude of the sense voltage is in the range of 0 [V] to VR as its maximum. In contrast, according to the second embodiment, the amplitude of the sense voltage is in the range of 0 [V] to Vpre (there is no limitation on Vpre). In addition, since the Vo capacitive load and the BL capacitive load are separated from each other, the Vo capacitive load is decreased for a high-speed operation.

In other words, according to this type, when the NMOS switch 51 is cut off in accordance with the increase in the electric potential of the sense node in the sense operation, thereafter, the capacitive load of the sense node and the capacitive load of the bit line BL are separated from each other. This type is generally termed a "charge transition type" or the like.

Also in the charge transition type, a "configuration of "a replica operation+a delay limiter" of the first embodiment may be used, and the VREF electric potential according to such a configuration can be automatically followed up.

Figure 14:
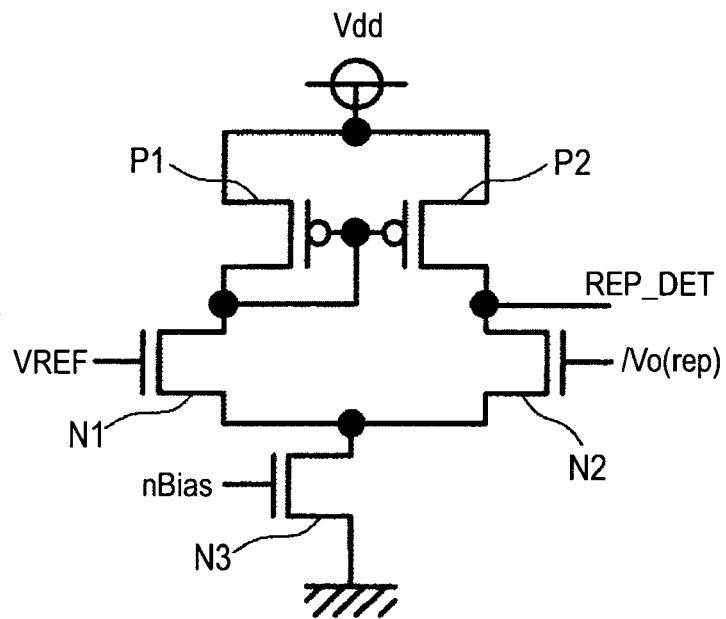
FIG. 14 is a circuit diagram representing an example of a differential amplifier that can be used in the first and second embodiments.

FIG. 14 represents a configuration example of the differential amplifier 54 shown in FIGS. 9 and 13.

This configuration is a general effective amplifier circuit that is configured by three NMOS transistors N1 to N3 and two PMOS transistors P1 and P2 shown in the figures.

<3. Modified Examples>

Figure 15:
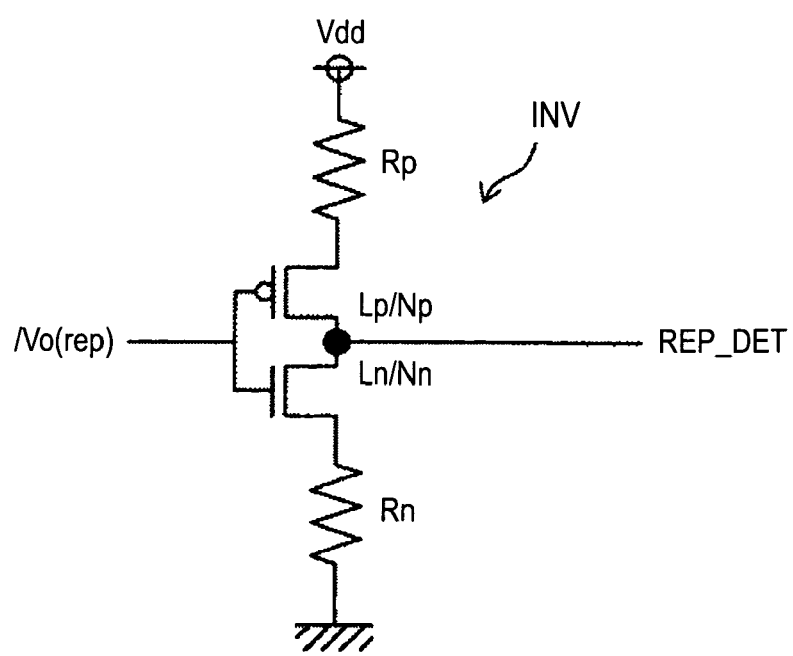
FIG. 15 is a circuit diagram representing an example of a simple discharge detecting circuit according to a modified example.

FIG. 15 represents a circuit configuration in which a differential amplifier 54 is used.

The configuration shown in FIG. 15 is a circuit in which detection of discharge is implemented by an inverter.

The inverter INV is formed through two resistors Rp and Rn. By adjusting the ratio between a PMOS size (Lp/Wp) and an NMOS size (Ln/Wn) that configure the inverter INV, a PMOS source line resistance (Rp) and an NMOS source line resistance (Rn), and the like, the value of the discharge threshold can be adjusted. Here, Lp and Ln denote lengths of the transistors, and Wp and Wn denote gate widths of the transistors.

Such a simple discharge detecting circuit is weak to noise. In addition, in the simple discharge detecting circuit, the timing when the replica output (REP_DET) is turned on may be easily changed. Thus, according to the first and second embodiments in which the sense timing is controlled in accordance with the change in the VREF electric potential due to noise or the like, a more marked application effect can be acquired in the circuit shown in FIG. 15.

In addition, as another modified example, the replica resistor Rrep may be configured by a plurality of unit resistors and a switch that changes the number of connected unit resistors.

This is a configuration for changing the adjustment range more appropriately by changing the discharge rate of the replica sense node.

The same advantages can be acquired by disposing a plurality of replica cells RepC and selecting one from among the replica cells by using an access transistor.

In the above-described two embodiments, a ReRAM has been described as an example. However, an embodiment of the present invention can be broadly applied to a variable resistance-type memory such as a phase-change memory other than the ReRAM.

In addition, in a different type of a non-volatile memory such as a flash memory, there are also cases where a read operation can be performed in which word line control is not performed, in other words, the current is not constant. For example, in an MCL-NOR type, there in an example reporting such an operation. Thus, in such an operation, there are cases where there is a remarkable difference in the sense timings in accordance with the logic of the read-out information or the type (mode) of a read operation.

Accordingly, it is preferable that an embodiment of the present invention is applied to a variable resistance-type memory having a wide dynamic range of a read-out current. However, the description of the embodiments presented above does not mean to exclude the application thereof to other types of non-volatile memories.

According to the first and second embodiments and the modified examples described above, in a ReRAM performing a so-called dynamic read operation, the sense amplifier can be activated at a timing according to the cell discharge rate. Accordingly, there is an advantage in that a design margin of a malfunction can be implemented in an easy manner. In addition, even when the discharge detection reference voltage VREF is set without a sufficient noise margin, the discharge detecting reference voltage is dynamically changed for the discharge curve, and thus a read operation, in which the setting range of VREF is wide at that amount, that is strong for a malfunction can be performed.

The present application contains subject matter related to that disclosed in Japanese Priority Patent Application JP 2009-257468 filed in the Japan Patent Office on Nov. 10, 2009, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A memory device comprising:
a memory unit that includes a first memory electrode and a second memory electrode, wherein an electric charge discharging rate between the first and second memory electrodes varies in accordance with a logic value of information stored in the memory unit;
a sense amplifier that detects the logic value of the stored information by comparing, during discharge of the memory unit, an electric potential of a wiring connected to the first memory electrode with a reference electric potential; and
a replica circuit that has a replica unit emulating the memory unit and generates a sense timing signal that controls a sense timing of the sense amplifier based on an electric charge discharging rate of the replica unit.

2. The memory device according to claim 1, wherein the replica circuit includes:
the replica unit;
a discharge detecting unit that detects discharge of the replica unit and generates a discharge detection signal when an electric potential of the replica unit has changed by a predetermined amount; and
an activation control unit that generates the sense timing signal based on the discharge detection signal and controls the sense timing of the sense amplifier to correspond to the sense timing signal.

3. The memory device according to claim 2, further comprising:
a discharge starting switch that simultaneously starts discharge of the replica unit and the memory unit in accordance with input of a read permission signal,
wherein the activation control unit includes:
a delay circuit that delays the input read permission signal; and
a NOR circuit that takes a logical sum of an output of the delay circuit and an output of the discharge detecting unit and outputs the sense timing signal to the sense amplifier based on a result of the logical sum.

4. The memory device according to claim 3, further comprising: a constant-current transistor that is connected to a discharge path of the replica unit and a discharge path of the memory unit and is biased so as to operate to be turned on in a strong inversion region.

5. The memory device according to claim 4, wherein the discharge detecting unit includes an inverter that:
receives as input the electric potential of a replica sense node, which decreases in magnitude in accordance with the discharge of the replica unit;
determines the decrease in the electric potential of the replica sense node using an inverter threshold; and
outputs the discharge detection signal at an inversion timing of the output of the inverter.

6. The memory device according to claim 5, further comprising a configuration in which a speed of the decrease in an electric potential of the replica sense node can be changed by a resistance value of the replica unit or the number of the replica units.

7. The memory device according to claim 5,
wherein NMOS switches are connected between a bit line to which the memory unit is connected and a sense node of the sense amplifier and between a replica bit line to which the replica unit is connected and the replica sense node, and
wherein the two NMOS switches are switched off by clamping electric potentials of the bit line and the replica bit line to a voltage that is acquired by decreasing a clamp voltage by a voltage between a gate and a source of the MOS transistor in a sense operation by applying the clamp voltage to each gate of the two NMOS switches.

8. The memory device according to claim 4,
wherein the discharge detecting unit has a comparator circuit that compares the electric potential of the replica sense node, with a discharge detecting reference electric potential, and outputs the discharge detection signal at an output inversion timing of the comparator circuit.

9. The memory device according to claim 8, further comprising a configuration in which a speed of the decrease in the electric potential of the replica sense node can be changed by a resistance value of the replica unit or the number of the replica units.

10. The memory device according to claim 8,
wherein NMOS switches that are respectively connected between a bit line to which the memory unit is connected and a sense node of the sense amplifier and between a replica bit line to which the replica unit is connected and a replica sense node, and
wherein the two NMOS switches are switched off by clamping an electric potential of the bit line and the replica bit line to a voltage that is acquired by decreasing a clamp voltage by a voltage between a gate and a source of the MOS transistor in a sense operation by applying the clamp voltage to each gate of the two NMOS switches.

11. The memory device according to claim 1, wherein the memory unit is a variable resistance-type memory unit in which logic of written information is different in accordance with a direction of an applied voltage.

12. The memory device according to claim 11, wherein the memory unit is formed by interposing a memory layer having a variable resistance value between the first and second memory electrodes.

13. A method of reading a memory device that comprises a memory unit that includes a first memory electrode and a second memory electrode, wherein an electric charge discharging rate between the first and second memory electrodes varies in accordance with a logic value of information stored in the memory unit, a sense amplifier that detects the logic value of the stored information by comparing an electric potential of a wiring connected to the first memory electrode during discharge of the memory unit with a reference electric potential, and a replica circuit that has a replica unit emulating the memory unit, the method comprising the step of:
generating a sense timing signal that controls a timing at which the sense amplifier senses the electric potential of the wiring connected to the first memory electrode based on an electric charge discharging rate of the replica unit, wherein discharge of the replica unit emulating the memory unit is started simultaneously with discharge of the memory unit.

14. The method of reading a memory device according to claim 13, further comprising:
generating a discharge detection signal when an electric potential of the replica unit has changed by a predetermined amount, wherein the sense timing signal is generated based on the discharge detection signal and controls the sense timing of the sense amplifier to correspond to the sense timing signal.

15. The method of reading a memory device according to claim 14, and the method further comprises:
inputting a read permission signal, which controls the start of discharge of the replica unit emulating the memory unit and discharge of the memory unit,
delaying the input read permission signal in a delay circuit; and
taking a logical sum of an output of the delay circuit and an output of the discharge detecting unit that generates the discharge detecting signal and outputting the sense timing signal based on the logical sum.

16. The method of reading a memory device according to claim 14, further comprising:
comparing the electric potential of the replica sense node with a discharge detecting reference electric potential in a comparator circuit, and outputting the discharge detection signal at an output inversion timing of the comparator circuit.

17. The method of reading a memory device according to claim 13, wherein the memory unit is a variable resistance-type memory unit in which logic of written information is different in accordance with a direction of an applied voltage.

18. The method of reading a memory device according to claim 13, wherein the memory unit is formed by interposing a memory layer having a variable resistance value between the first and second memory electrodes.

* * * * *